United States Patent
Ikeda et al.

(10) Patent No.: US 11,410,835 B2
(45) Date of Patent: Aug. 9, 2022

(54) PLASMA DENSITY MONITOR, PLASMA PROCESSING APPARATUS, AND PLASMA PROCESSING METHOD

(71) Applicant: Tokyo Electron Limited, Tokyo (JP)

(72) Inventors: Taro Ikeda, Nirasaki (JP); Eiki Kamata, Nirasaki (JP); Mikio Sato, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 254 days.

(21) Appl. No.: 16/883,500

(22) Filed: May 26, 2020

(65) Prior Publication Data

US 2020/0381224 A1    Dec. 3, 2020

(30) Foreign Application Priority Data

May 27, 2019   (JP) .............................. JP2019-098867

(51) Int. Cl.
*H01J 37/32*   (2006.01)
*H01L 21/67*   (2006.01)

(52) U.S. Cl.
CPC .... *H01J 37/32935* (2013.01); *H01J 37/3222* (2013.01); *H01J 37/32201* (2013.01); *H01J 37/32229* (2013.01); *H01J 37/32275* (2013.01); *H01L 21/67253* (2013.01); *H01J 2237/24564* (2013.01)

(58) Field of Classification Search
CPC ............. H01J 37/32201; H01J 37/3222; H01J 37/32229; H01J 37/32275; H01J 37/32935; H01J 2237/24564; H01L 21/67253
See application file for complete search history.

(56) References Cited

U.S. PATENT DOCUMENTS

| 11,081,317 B2* | 8/2021 | Chua ................ H01J 37/32201 |
| 2006/0137613 A1* | 6/2006 | Kasai .................. H01J 37/3222 |
| | | 118/723 ME |

FOREIGN PATENT DOCUMENTS

| JP | 2000-294550 A | 10/2000 |
| JP | 2013-77441 A | 4/2013 |

* cited by examiner

*Primary Examiner* — Kurtis R Bahr
(74) *Attorney, Agent, or Firm* — Nath, Goldberg & Meyer; Jerald L. Meyer; Tanya E. Harkins

(57) ABSTRACT

A plasma density monitor for monitoring a plasma density of surface wave plasma in a chamber accommodating a substrate and performs a plasma process on the substrate. The monitor includes: a monopole antenna installed to extend from a wall of the chamber toward an interior of the chamber and to be perpendicular to an inner wall surface of the chamber, and configured to receive a surface wave; a coaxial line configured to extract a detection value from a signal received by the monopole antenna; a length adjuster configured to adjust a length of the monopole antenna; and a controller configured to control the length adjuster so as to obtain a wavelength of the surface wave and the plasma density of the surface wave plasma from the wavelength of the surface wave.

20 Claims, 8 Drawing Sheets

PLASMA DENSITY MONITOR, PLASMA PROCESSING APPARATUS, AND PLASMA PROCESSING METHOD

CROSS-REFERENCE TO RELATED APPLICATION

This application is based upon and claims the benefit of priority from Japanese Patent Application No. 2019-098867, filed on May 27, 2019, the entire contents of which are incorporated herein by reference.

TECHNICAL FIELD

The present disclosure relates to a plasma density monitor, a plasma processing apparatus, and a plasma processing method.

BACKGROUND

In a manufacturing process of a semiconductor device, a plasma process is extensively used for an etching process, a film-forming process, or the like performed on a semiconductor substrate. Recently, as a plasma processing apparatus for performing such a plasma process, a microwave plasma processing apparatus capable of uniformly forming plasma having a high density and a low electron temperature has attracted attention.

Patent Document 1 discloses an RLSA (registered trademark) microwave plasma processing apparatus as a microwave processing apparatus. The RLSA (registered trademark) microwave plasma processing apparatus has a planar slot antenna in which a number of slots are formed in a predetermined pattern in an upper portion of a chamber, and radiates a microwave guided from a microwave generation source from the slots of the planar antenna. Then, the radiated microwave is radiated into the chamber held in a vacuum through a microwave transmission window made of a dielectric material installed thereunder so as to form surface wave plasma by a gas introduced into the chamber by the microwave electric field and process a semiconductor wafer.

PRIOR ART DOCUMENTS

Patent Documents

Patent Document 1: Japanese laid-open publication No. 2000-294550

SUMMARY

According to one embodiment of the present disclosure, there is provided a plasma density monitor for monitoring a plasma density of surface wave plasma in a chamber accommodating a substrate and performs a plasma process on the substrate. The monitor includes: a monopole antenna installed to extend from a wall of the chamber toward an interior of the chamber and to be perpendicular to an inner wall surface of the chamber, and configured to receive a surface wave; a coaxial line configured to extract a detection value from a signal received by the monopole antenna; a length adjuster configured to adjust a length of the monopole antenna; and a controller configured to control the length adjuster so as to obtain a wavelength of the surface wave and the plasma density of the surface wave plasma from the wavelength of the surface wave.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Configuration of the Plasma Processing Apparatus>

Figure 1:
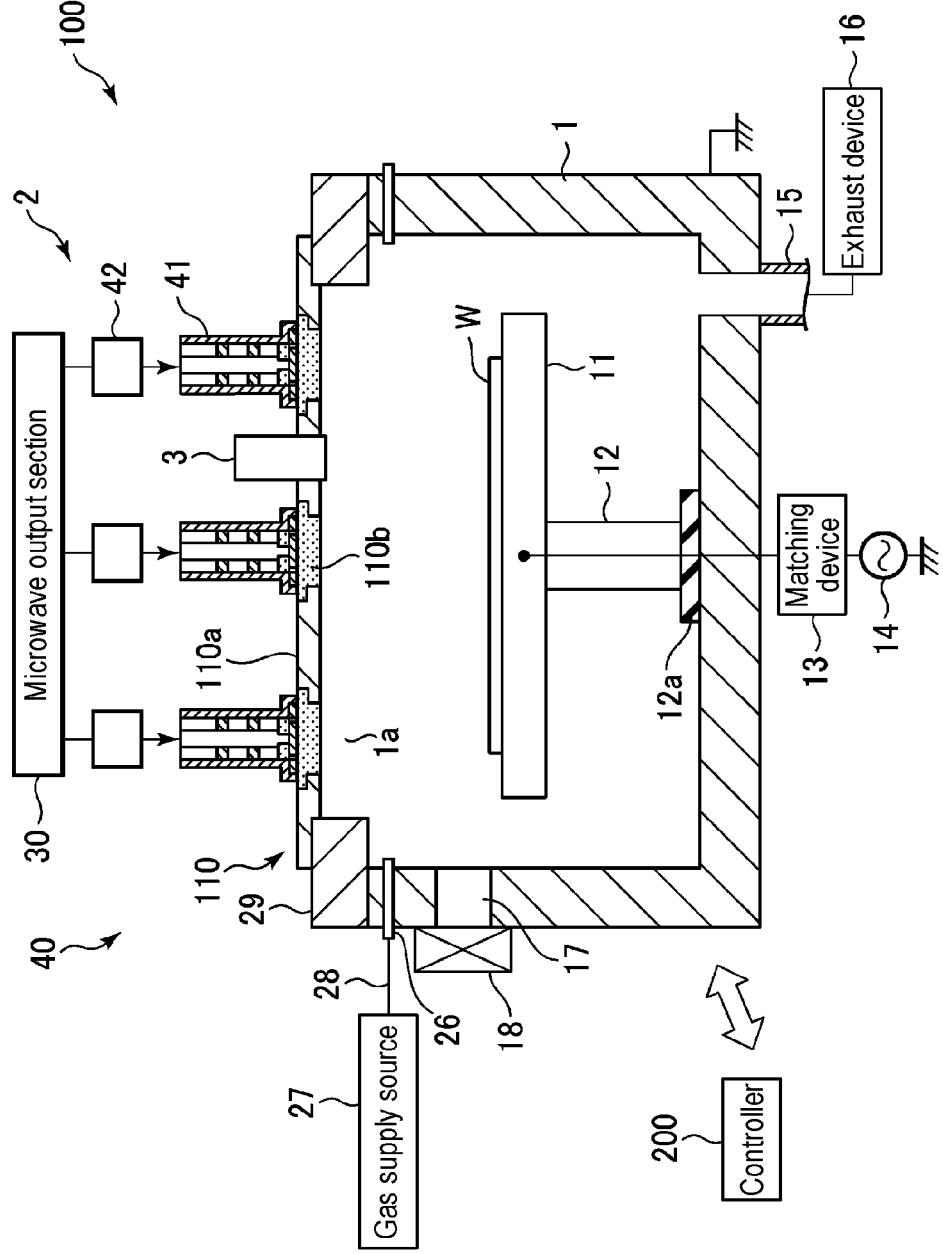
FIG. 1 is a cross-sectional view illustrating a schematic configuration of a plasma processing apparatus equipped with a plasma density monitor according to an embodiment of the present disclosure.
Figure 2:
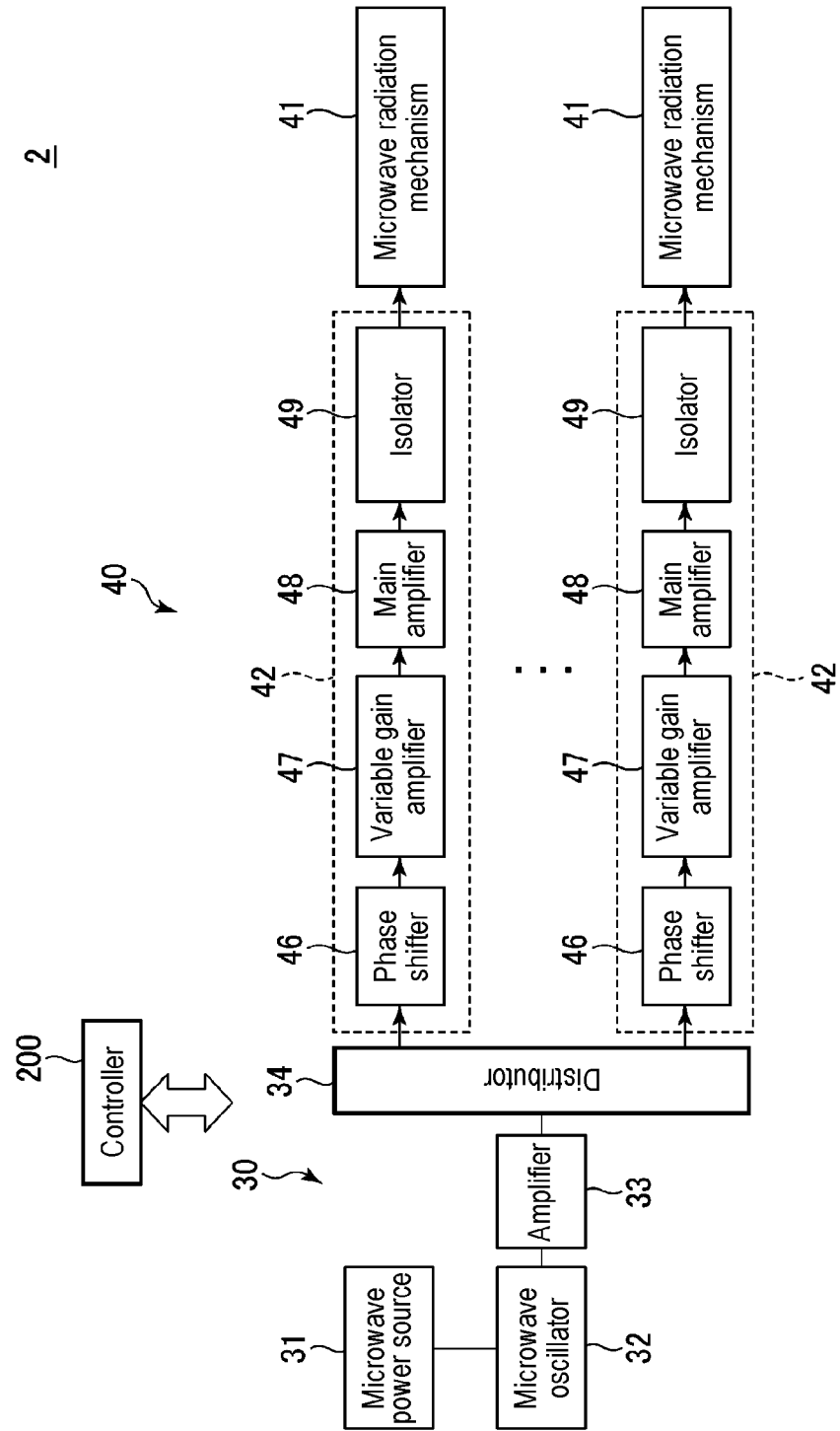
FIG. 2 is a block diagram illustrating a configuration of a plasma source used for the plasma processing apparatus in FIG. 1.
Figure 3:
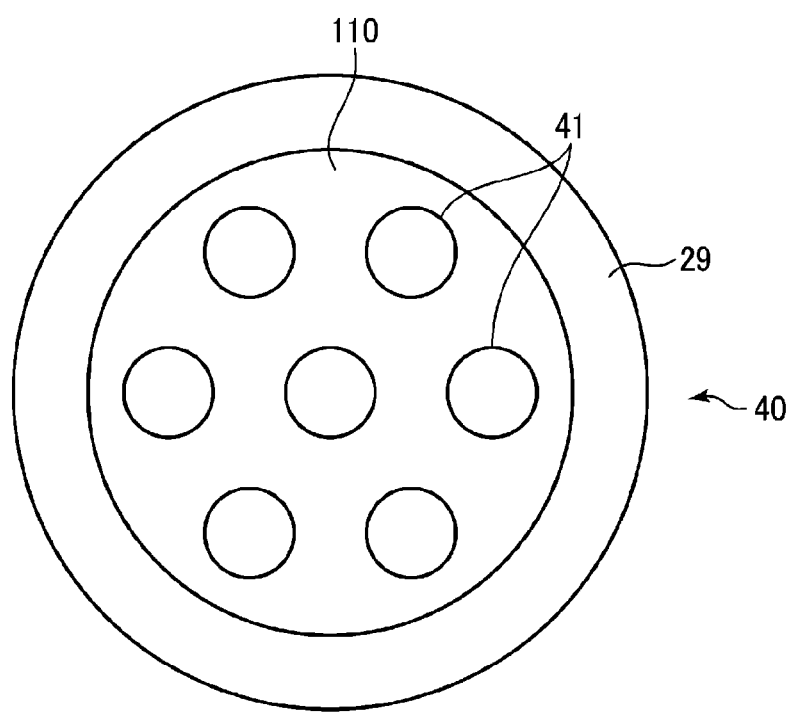
FIG. 3 is a plan view schematically illustrating a microwave supplier in the plasma source.
Figure 4:
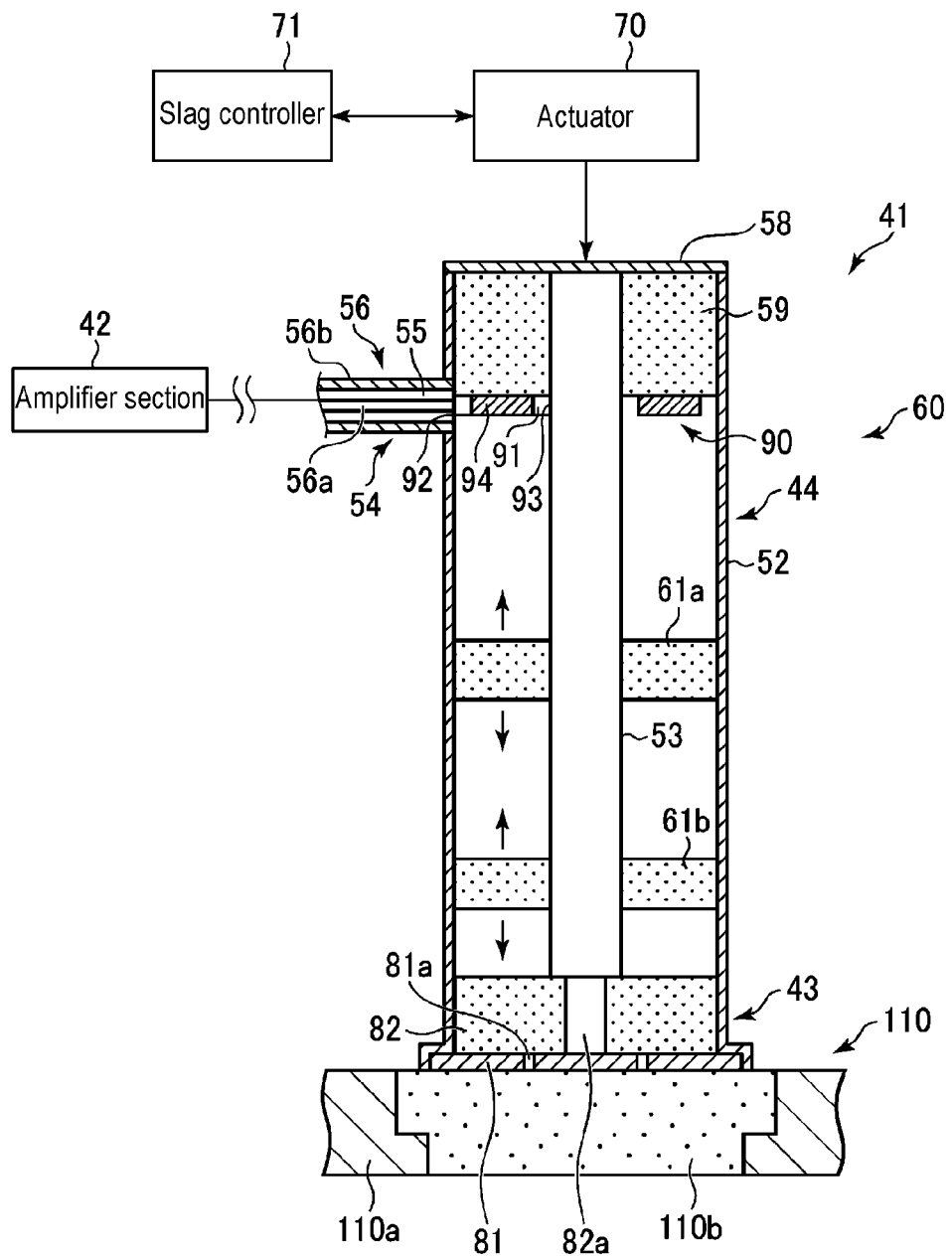
FIG. 4 is a vertical cross-sectional view illustrating a microwave radiation mechanism in the plasma source.
Figure 5:
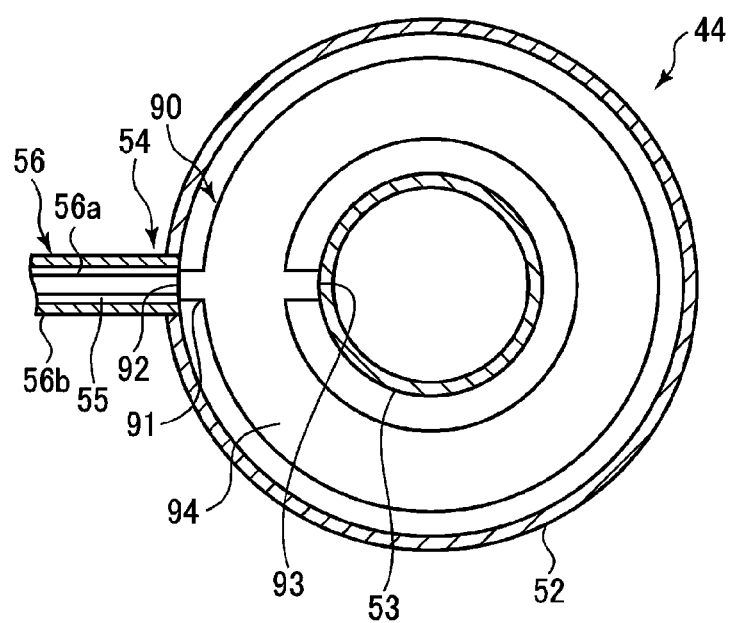
FIG. 5 is a cross-sectional view illustrating a power supply mechanism of the microwave radiation mechanism.

FIG. 1 is a cross-sectional view illustrating a schematic configuration of a plasma processing apparatus equipped with a plasma density monitor according to an embodiment of the present disclosure. FIG. 2 is a block diagram illustrating a configuration of a plasma source used for the plasma processing apparatus in FIG. 1. FIG. 3 is a plan view schematically illustrating a microwave supplier in the plasma source. FIG. 4 is a cross-sectional view illustrating a microwave radiation mechanism in the plasma source. FIG. 5 is a cross-sectional view illustrating a power supply mechanism of the microwave radiation mechanism.

A plasma processing apparatus 100 is configured as a plasma etching apparatus which performs, for example, an etching process, as a plasma process on a semiconductor wafer W (hereinafter, referred to as a "wafer W") which can be considered a substrate, and performs the plasma process by surface wave plasma. The plasma processing apparatus 100 includes a substantially cylindrical grounded chamber 1 made of a metal material such as aluminum or stainless steel, which is airtightly configured, a plasma source 2 for forming the surface wave plasma in the chamber 1, and a plasma density monitor 3. An opening 1a is formed in an upper portion of the chamber 1, and the plasma source 2 is installed so as to face the interior of the chamber 1 from the opening 1a.

A susceptor 11, which is a support member configured to horizontally support the wafer W, is installed in the chamber 1 so as to be supported by a cylindrical support member 12 erected at the center of the bottom of the chamber 1 via an insulating member 12a. Aluminum or the like whose surface is anodized is exemplified as a material constituting the susceptor 11 and the support member 12.

In addition, although not illustrated, an electrostatic chuck for electrostatically adsorbing the wafer W, a temperature control mechanism, a gas passage for supplying a gas for heat transfer to the rear surface of the wafer W, an elevating pin for elevating and lowering the wafer W for its transfer, and the like are installed in the susceptor 11. Furthermore, a high-frequency bias power source 14 is electrically connected to the susceptor 11 via a matching device 13. When high-frequency power is supplied from the high-frequency bias power source 14 to the susceptor 11, ions in the plasma are drawn into the wafer W.

An exhaust pipe 15 is connected to the bottom of the chamber 1, and an exhaust device 16 including a vacuum pump is connected to the exhaust pipe 15. Furthermore, the exhaust device 16 is operated such that the gas in the chamber 1 is discharged and the interior of the chamber 1 can be quickly depressurized to a predetermined level of vacuum. In addition, a loading/unloading port 17 for loading and unloading the wafer W and a gate valve 18 for opening and closing the loading/unloading port 17 are installed on a sidewall of the chamber 1.

A ring-shaped gas introduction member 26 is installed in the upper portion of the chamber 1 along the wall of the chamber. A plurality of gas discharge holes are formed on an inner periphery of the gas introduction member 26. A gas supply source 27 for supplying a gas such as a plasma-generating gas and a processing gas is connected to the gas introduction member 26 via a pipe 28. As the plasma-generating gas, it may be possible to suitably use a rare gas such as an Ar gas or the like. Furthermore, as the processing gas, it may be possible to use an etching gas usually used for an etching process, for example, a $Cl_2$ gas or the like.

The plasma-generating gas introduced into the chamber 1 from the gas introduction member 26 is plasmarized by a microwave introduced into the chamber 1 from the plasma source 2. Thereafter, when the processing gas is introduced from the gas introduction member 26, the processing gas is excited by the plasma of the plasma-generating gas to be plasmarized, and the plasma process is performed on the wafer W by the plasma of the processing gas.

<Plasma Source>

Next, the plasma source 2 will be described.

The plasma source 2 serves to generate surface wave plasma in the chamber 1, and has a circular ceiling plate 110 supported by a support ring 29 installed in the upper portion of the chamber 1. The support ring 29 and the ceiling plate 110 are airtightly sealed to each other. The ceiling plate 110 also serves as an upper wall of the chamber 1. As illustrated in FIG. 2, the plasma source 2 has a microwave output section 30 for outputting and distributing the microwave to a plurality of paths, and a microwave supplier 40 for transmitting the microwave outputted from the microwave output section 30 so as to radiate the microwave into the chamber 1.

The microwave output section 30 has a microwave power source 31, a microwave oscillator 32, an amplifier 33 for amplifying an oscillated microwave, and a distributor 34 for distributing the amplified microwave to a plurality of parts.

The microwave oscillator 32 oscillates the microwave having a predetermined frequency (e.g., 915 MHz) by, for example, PLL oscillation. The distributor 34 distributes the microwave amplified by the amplifier 33 while performing impedance matching on the input side and the output side so as to minimize the microwave loss. As the microwave frequency, a desired frequency in the range of 700 MHz to 3 GHz may be used in addition to the predetermined frequency of 915 MHz.

The microwave supplier 40 has a plurality of amplifier sections 42 for mainly amplifying the microwave distributed by the distributor 34, and microwave radiation mechanisms 41 respectively connected to the plurality of amplifier sections 42.

As illustrated in FIG. 3, for example, a total of seven microwave radiation mechanisms 41 are arranged on the ceiling plate 110 (six in a circumferential shape and one at the center of the ceiling plate 110).

The ceiling plate 110 serves as a vacuum seal and a microwave transmission plate, and has a frame 110a made of metal and a microwave transmission window 110b made of a dielectric material, such as a quartz, fitted into the frame 110a and installed so as to correspond to a portion in which the microwave radiation mechanism 41 is arranged.

The amplifier sections 42 each have a phase shifter 46, a variable gain amplifier 47, a main amplifier 48 constituting a solid state amplifier, and an isolator 49.

The phase shifter 46 is configured to change the phase of the microwave, and can modulate radiation characteristics by adjusting the phase of the microwave. For example, the plasma distribution may be adjusted by adjusting the phase of each amplifier section 42 to control the directivity, or a circularly polarized wave may be obtained by shifting the phase by 90° in adjacent amplifier sections 42. Furthermore, the phase shifter 46 can be used for adjusting delay characteristics between components in the amplifier and for spatial synthesis in the tuner. However, when it is not necessary to modulate the radiation characteristics or to adjust the delay characteristics between the components in the amplifier, the phase shifter 46 is not required.

The variable gain amplifier 47 is an amplifier which adjusts variations of individual antenna modules or adjusts plasma intensity by adjusting the power level of the microwave input to the main amplifier 48. By changing the variable gain amplifier 47 for each amplifier section 42, it is possible to generate distribution in the generated plasma.

The main amplifier 48 constituting the solid state amplifier may be configured to have, for example, an input matching circuit, a semiconductor amplification element, an output matching circuit, and a high-Q resonance circuit.

The isolator 49 isolates the reflected microwave which is reflected from the microwave radiation mechanism 41 and directs to the main amplifier 48, and has a circulator and a dummy load (coaxial terminator). The circulator guides the microwave reflected from an antenna part 43 of the microwave radiation mechanism 41 to be described later, to the dummy load which converts the reflected microwave guided by the circulator into heat.

As illustrated in FIG. 4, the microwave radiation mechanism 41 includes a waveguide 44 (microwave transmission path) having a coaxial structure for transmitting the microwave, and the antenna part 43 for radiating the microwave transmitted through the waveguide 44 into the chamber 1. Furthermore, the microwave radiated from the microwave radiation mechanism 41 into the chamber 1 is synthesized in a space in the chamber 1 so as to form surface wave plasma in the chamber 1.

The waveguide 44 is configured so that a cylindrical outer conductor 52 and a rod-shaped inner conductor 53 installed at the center of the cylindrical outer conductor 52 are coaxially arranged, and the antenna part 43 is installed at a leading end of the waveguide 44. In the waveguide 44, the inner conductor 53 is on the power supply side, and the outer conductor 52 is on the ground side. A reflection plate is installed on the upper ends of the outer conductor 52 and the inner conductor 53.

A power supply mechanism 54 for supplying the microwave (electromagnetic wave) is installed at a base end portion of the waveguide 44. The power supply mechanism 54 has a microwave power introduction port 55 installed on the side surface of the waveguide 44 (the outer conductor 52) for introducing microwave power. A coaxial line 56 consisting of an inner conductor 56a and an outer conductor 56b is connected to the microwave power introduction port 55 as a power supply line for supplying the microwave amplified from the amplifier section 42. In addition, a feed antenna 90 horizontally extending toward the inside of the outer conductor 52 is connected to the leading end of the inner conductor 56a of the coaxial line 56.

The feed antenna 90 is formed by, for example, chipping away a metal plate, such as aluminum or the like, and then inserting into the die of a dielectric member such as Teflon (registered trademark) or the like. A wave retardation member 59 made of a dielectric material is installed between the reflection plate 58 and the feed antenna 90. When a microwave having a high frequency such as 2.45 GHz is used, the wave retardation member 59 may not be installed. By reflecting the electromagnetic wave radiated from the feed antenna 90 by the reflection plate 58, the maximum electromagnetic wave is transmitted into the waveguide 44 having the coaxial structure. In this case, it is preferable to set the distance from the feed antenna 90 to the reflection plate 58 at half wavelength times of about $\lambda g/4$. However, in the case of a microwave having a low frequency, this may not be applied due to radial restrictions. In such a case, it is preferable to optimize the shape of the feed antenna so that the antinode of the electromagnetic wave generated by the feed antenna 90 is induced below the feed antenna 90 instead of being induced to the feed antenna 90.

As illustrated in FIG. 5, the feed antenna 90 is connected to the inner conductor 56a of the coaxial line 56 at the microwave power introduction port 55, includes an antenna main body 91 having a first pole 92 to which the electromagnetic wave is supplied and a second pole 93 radiating the supplied electromagnetic wave, and a ring-shaped reflector 94 extending from both sides of the antenna main body 91 along the exterior of the inner conductor 53. The feed antenna 90 configured to form a standing wave from the electromagnetic wave incident on the antenna main body 91 and the electromagnetic wave reflected from the reflector 94. The second pole 93 of the antenna main body 91 is in contact with the inner conductor 53.

The microwave power is supplied to the space between the outer conductor 52 and the inner conductor 53 by radiating the microwave (electromagnetic wave) from the feed antenna 90. Then, the microwave power supplied to the power supply mechanism 54 propagates toward the antenna part 43.

A tuner 60 is installed in the waveguide 44. The tuner 60 has two slags 61a and 61b installed between the outer conductor 52 and the inner conductor 53, and an actuator 70 for driving the slag installed outside (at an upper side of) the reflection plate 58. The tuner 60 serves to match the impedance of the load (plasma) in the chamber 1 with the characteristic impedance of the microwave power source in the microwave output section 30 by independently driving the two slags 61a and 61b. For example, it is configured so that two slag moving shafts (not shown) formed of screw rods are installed in the internal space of the inner conductor 53 so as to extend in the longitudinal direction, and the actuator 70 has two motors for independently rotating each slag moving shaft. Therefore, the slags 61a and 61b can be independently moved up and down by individually rotating the respective slag moving shafts by the motors of the actuator 70.

The positions of the slags 61a and 61b are controlled by a slag controller 71. For example, the slag controller 71 sends a control signal to the motors constituting the actuator 70 based on an impedance value of the input end detected by an impedance detector (not shown) and position information of the slags 61a and 61b detected by an encoder or the like. Therefore, the positions of the slags 61a and 61b are controlled, and the impedance is adjusted. The slag controller 71 performs impedance matching so that the termination is, for example, 50Ω. When only one of the two slags is moved, a locus passing through the origin of the Smith chart is drawn. When both of the two slags are simultaneously moved, only the phase is rotated.

The antenna part 43 has a planar slot antenna 81 having a planar shape, and a wave retardation member 82 installed on the rear surface (upper surface) of the planar slot antenna 81. A cylindrical member 82a made of a conductor connected to the inner conductor 53 passes through the center of the wave retardation member 82, and is connected to the planar slot antenna 81. The wave retardation member 82 and the planar slot antenna 81 have a disc shape with a larger diameter than that of the outer conductor 52. The lower end of the outer conductor 52 extends to the planar slot antenna 81, and the periphery of the wave retardation member 82 is covered with the outer conductor 52.

The planar slot antenna 81 has a slot 81a for radiating the microwave. The number, arrangement, and shape of the slots 81a are properly set so that the microwave is efficiently radiated. A dielectric material may be inserted into the slot 81a.

The wave retardation member 82 has a dielectric constant higher than that of a vacuum, and is made of, for example, a fluorine-based resin such as quartz, ceramics or polytetrafluoroethylene, or a polyimide-based resin. The wave retardation member 82 has a function of reducing the antenna by making the wavelength of the microwave shorter than that in the vacuum. The phase of the microwave can be adjusted by the thickness of the wave retardation member 82, and the thickness the wave retardation member 82 is adjusted so that the planar slot antenna 81 becomes the "antinode" of the standing wave. Thus, the reflection can be minimized and the radiation energy of the planar slot antenna 81 can be maximized.

The microwave transmission window 110b of the ceiling plate 110 is further arranged at the leading end side of the planar slot antenna 81. Furthermore, the microwave amplified by the main amplifier 48 passes between the peripheral walls of the inner conductor 53 and the outer conductor 52, transmits through the microwave transmission window 110b from the planar slot antenna 81, and then is radiated to the space in the chamber 1. The microwave transmission window 110b may also be made of a dielectric material similar to that of the wave retardation member 82.

In the present embodiment, the main amplifier 48, the tuner 60, and the planar slot antenna 81 are arranged close to one another. Furthermore, the tuner 60 and the planar slot antenna 81 constitute a concentrated constant circuit existing within a half wavelength, and the planar slot antenna 81, the wave retardation member 82, and the microwave transmission window 110b have a composite resistance of 50Ω. For this reason, the tuner 60 is directly tuned to the plasma load so that energy can efficiently be transmitted to the plasma.

The respective components of the plasma processing apparatus 100 are configured to be controlled by a controller 200 including a microprocessor. The controller 200 includes a storage part which stores a process sequence of the plasma processing apparatus 100 and a process recipe as a control parameter, an input means, a display, and the like, and is configured to control the plasma processing apparatus 100 according to a selected process recipe.

<Plasma Density Monitor>

Next, a plasma density monitor 3 will be described.

Figure 6:
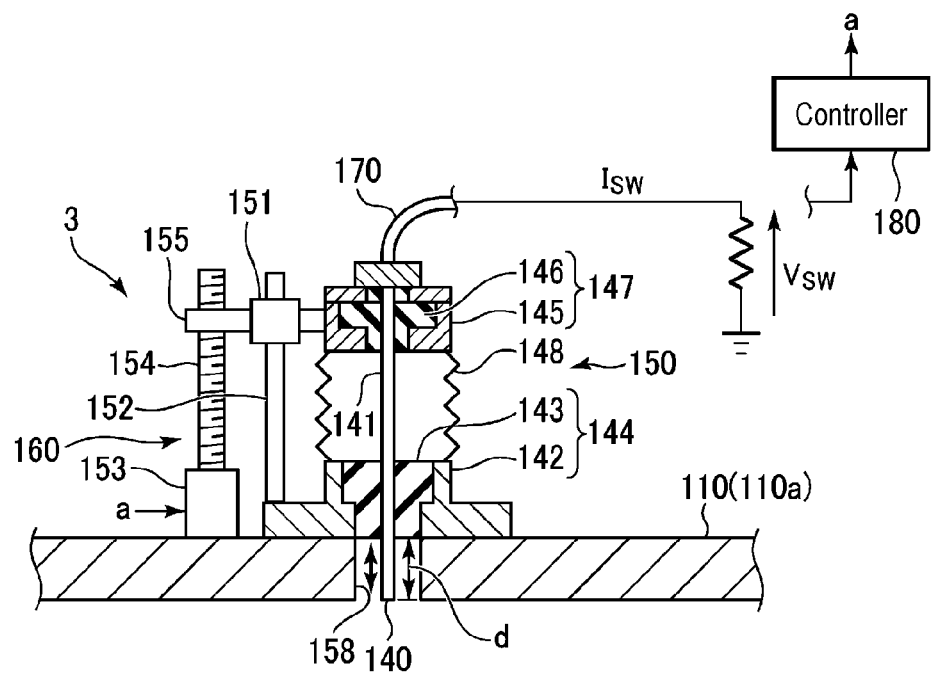
FIG. 6 is a cross-sectional view illustrating a schematic configuration of a plasma density monitor.

FIG. 6 is a cross-sectional view illustrating a schematic configuration of the plasma density monitor 3. The plasma density monitor 3 monitors a plasma density (electron density) of the surface wave plasma formed in the chamber 1. The plasma density monitor 3 has a monopole antenna 140 installed so that a length of the monopole antenna 140 is variable from the wall of the chamber 1 (the ceiling plate 110 serving as the upper wall in this example) toward the interior of the chamber 1. The diameter of the monopole antenna 140 is preferably in the range of 2 to 3 mm. Furthermore, as will be described hereinbelow, the plasma density monitor 3 further includes a coaxial line 150 for extracting a signal of the monopole antenna 140, a length adjuster 160 for adjusting the length of the monopole antenna 140, and a controller 180.

A recess 158 having a size allowing the surface wave to enter is formed in a portion of the frame 110a of the ceiling plate 110 serving as the upper wall of the chamber 1. The monopole antenna 140 protrudes from the bottom surface of the recess 158 to be perpendicular to the inner surface of the ceiling plate 110. The monopole antenna 140 is configured by a leading end portion of an antenna rod 141 existing in the chamber 1 (in the recess 158). The antenna rod 141 is inserted from the outside (upper side) of the chamber 1 toward the inside of the chamber 1. The antenna rod 141 including the monopole antenna 140 is made of a conductor (metal) such as aluminum or the like.

A guide member 144 for guiding the antenna rod 141 is installed in a portion corresponding to the recess 158 on the rear surface side of the frame 110a portion of the ceiling plate 110. The guide member 144 has a metallic ring-shaped flange member 142 fixed to the frame 110a, and a dielectric member 143 fitted and inserted to the inner portion of the flange member 142. The antenna rod 141 insertedly passes through the dielectric member 143, so as to allow the dielectric member 143 to guide the antenna rod 141.

An elevating member 147 is installed above the guide member 144 so as to fix the antenna rod 141 and elevate and lower the antenna rod 141. The elevating member 147 has a metallic ring member 145 and a dielectric member 146 fitted and inserted to the inner portion of the ring member 145. The upper end of the antenna rod 141 is fixed to the dielectric member 146. A coaxial cable 170 is connected to the elevating member 147. An inner conductor of the coaxial cable 170 is connected to the antenna rod 141, and an outer conductor thereof is connected to the ring member 145.

The flange member 142 of the guide member 144 and the ring member 145 of the elevating member 147 are connected by a bellows 148. The inside of the bellows 148 is kept in the same vacuum state as in the chamber 1.

The elevating member 147 is connected to a slider 151, which can be moved up and down by being guided by a vertically extending guide member 152. A motor 153 is fixed in a vicinity of the guide member 152 on the rear surface of the frame 110a. A screw rod 154 connected to a rotary shaft of the motor 153 is vertically installed. A stepping motor may be used as the motor 153. A nut part 155 screwed to the screw rod 154 is connected to the slider 151 so that the slider 151 is elevated and lowered through the nut part 155 by rotating the screw rod 154 by the motor 153, and the elevating member 147 is elevated and lowered therewith. Then, the antenna rod 141 is moved up and down according to the elevating and lowering of the elevating member 147 such that the length of the monopole antenna 140 at the leading end of the antenna rod 141 is adjusted. A length d of the monopole antenna 140 in this example corresponds to a distance from the lower surface of the dielectric member 143, which is the bottom surface of the recess 158, to the leading end of the antenna rod 141.

A portion of the antenna rod 141 which extends upward from the monopole antenna 140 serves as the inner conductor. The flange member 142, the bellows 148 and the ring member 145 serve as the outer conductor. The inner conductor, the outer conductor and the coaxial cable 170 constitute the coaxial line 150.

Furthermore, the motor 153, the screw rod 154, the nut part 155, the guide member 152, and the slider 151 constitute the length adjuster 160 for adjusting the length of the monopole antenna 140. By using the high-precision stepping motor as the motor 153 of the length adjuster 160, it is possible to adjust the length d of the monopole antenna 140 with high accuracy in 0.1 mm steps.

Figure 7:
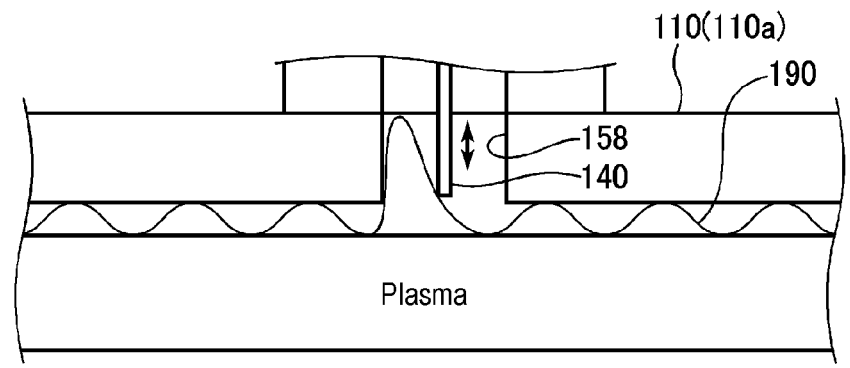
FIG. 7 is a schematic diagram illustrating a state in which a monopole antenna receives a surface wave of plasma.

The coaxial line 150 is connected to the controller 180 via the coaxial cable 170. As illustrated in FIG. 7, the monopole antenna 140 receives a surface wave 190 formed on the surface of the surface wave plasma and existing in a vicinity of the inner wall surface of the frame 110a of the ceiling plate 110 serving as the upper wall of the chamber 1. An electric field intensity of the received surface wave 190 is extracted as, for example, a surface wave detection current $I_{SW}$, by the coaxial line 150 and is sent to the controller 180. The detection of the surface wave detection current $I_{SW}$ may be performed through a voltage drop (voltage value) $V_{SW}$ of a resistor.

Figure 8:
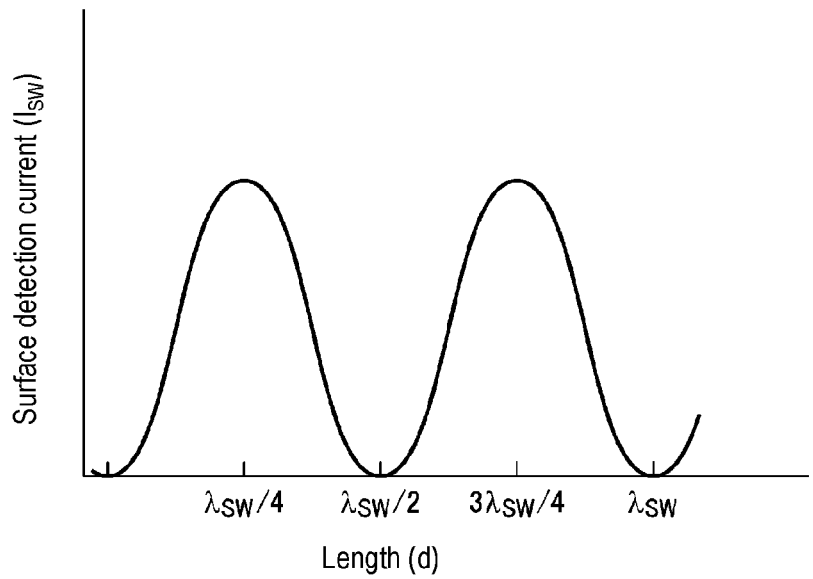
FIG. 8 is a diagram illustrating a relationship between a length d of the monopole antenna and a surface wave detection current $I_{SW}$.

The controller 180 obtains a wavelength $\lambda_{SW}$ of the surface wave based on a relationship between the length d of the monopole antenna 140 and the surface wave detection current $I_{SW}$ (voltage value $V_{SW}$) illustrated in FIG. 8 by controlling the length of the monopole antenna 140 using the length adjuster 160.

That is, a value of the surface wave detection current $I_{SW}$ (i.e., a voltage value $V_{SW}$) becomes a maximum value when the length d of the monopole antenna 140 is $\lambda_{SW}/4$, and becomes 0 when the length d is $\lambda_{SW}/2$. Therefore, while changing, for example, the length d of the monopole antenna 140, by controlling the length adjuster 160 using the controller 180, a value of the length d at which the voltage value $V_{SW}$ is maximized is obtained to allow the value of the length d to become $\lambda_{SW}/4$, or a value of the length d at which the voltage value $V_{SW}$ is 0 is obtained to allow the value of the length d to become $\lambda_{SW}/2$. Thus, it is possible to obtain the wavelength $\lambda_{SW}$ of the surface wave. Furthermore, since the maximum value of the surface wave detection current $I_{SW}$ (voltage value $V_{SW}$) appears at $(2n-1) \times \lambda_{SW}/4$ (where n is a natural number of 1 or more) of the length d, and 0 appears as $n \times \lambda_{SW}/2$ (where n is a natural number of 1 or more) of the length d, a value of d when n is 2 or more in $(2n-1) \times \lambda_{SW}/4$ and $n \times \lambda_{SW}/2$ may be used.

Meanwhile, a plasma density (electron density) $n_e$ of the surface wave plasma and the wavelength $\lambda_{SW}$ of the surface wave will be expressed by the following Eqs. (1) and (2), respectively.

$$n_e = \frac{m_e \varepsilon_0}{e^2} \omega_{pe}^2 \quad \text{Eq. (1)}$$

$$\lambda_{SW} = \frac{2\pi c}{\omega} \kappa_d^{-1/2} \left( \frac{\omega_{pe}^2 - \omega^2}{\omega_{pe}^2 - (1 + \kappa_d)\omega^2} \right)^{-1/2} \quad \text{Eq. (2)}$$

Where $m_e$ is a mass of electrons, $\varepsilon_0$ is a dielectric constant of vacuum, e is an elementary charge, $\omega_{pe}$ is an electron plasma frequency, c is a speed of light, $\omega$ is a frequency of the microwave, $\kappa_D$ is a relative dielectric constant of a material around the monopole antenna.

Figure 9:
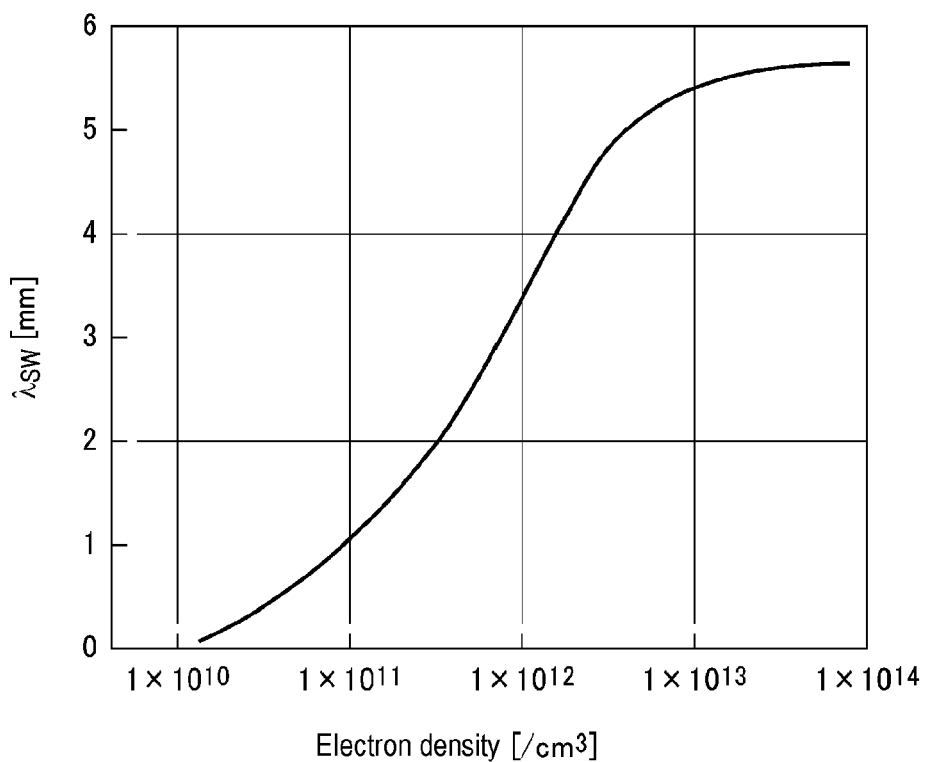
FIG. 9 is a diagram illustrating a relationship between a plasma density (electron density) and a wavelength of the surface wave.

In Eqs. (1) and (2), since others except for the plasma density (electron density) $n_e$ and the wavelength $\lambda_{SW}$ of the surface wave are known, the relationships between the plasma density (electron density) $n_e$ and the wavelength $\lambda_{SW}$ of the surface wave can be obtained from Eqs. (1) and (2), and these relationships are as illustrated in FIG. 9. The controller 180 obtains the plasma density based on the relationship between the wavelength $\lambda_{SW}$ of the surface wave obtained as described above and FIG. 9. Therefore, the plasma density of the surface wave plasma is monitored. When the frequency range of the microwave is set to 500 to 2,450 MHz, which is usually used, in the plasma processing apparatus in FIG. 1, the wavelength $\lambda_{SW}$ of the surface wave is calculated to be about 2 to 4 mm based on a relationship between a plasma density obtained by an experiment and FIG. 9. Therefore, for example, when the length d of the monopole antenna 140 is adjusted to $\lambda_{SW}/4$ which is the maximum value, d is in the range of about 0.5 to 1 mm.

As described above, the wavelength $\lambda_{SW}$ of the surface wave can be obtained based on the relationship between the length d of the monopole antenna 140 and the surface wave detection current $I_{SW}$ illustrated in FIG. 8, and the plasma density $n_e$ can be obtained from the obtained $\lambda_{SW}$ based on the relationship illustrated in FIG. 9. In other words, the plasma density of the surface wave plasma can be monitored by obtaining the wavelength $\lambda_{SW}$ of the surface wave by means of changing the length d of the monopole antenna 140.

Figure 10:
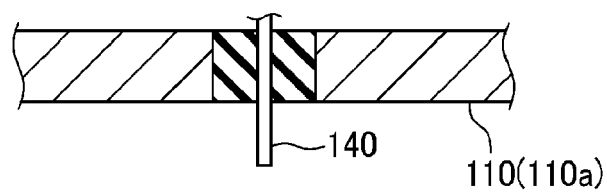
FIG. 10 is a cross-sectional view illustrating an example in which the monopole antenna is installed so as to protrude from a wall of a chamber without forming a recess in the wall of the chamber.
Figure 11:
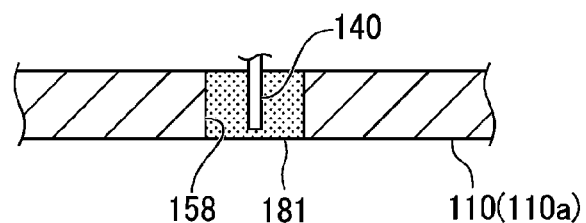
FIG. 11 is a cross-sectional view illustrating an example in which a dielectric member is embedded in the recess in which the monopole antenna of the wall of the chamber is installed.
Figure 12:
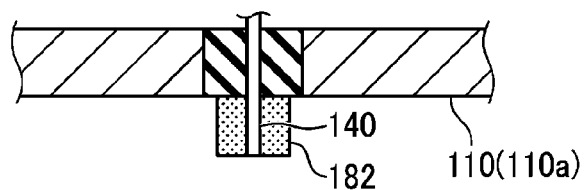
FIG. 12 is a cross-sectional view illustrating an example in which the dielectric member is installed around the monopole antenna installed so as to protrude from the wall of the chamber.

As shown in FIG. 6, since the monopole antenna 140 is installed to protrude vertically from the bottom surface of the recess 158, the monopole antenna 140 is configured to be difficult to protrude from the lower surface of the ceiling plate 110 (frame 110a) constituting the upper wall of the chamber 1. Thus, occurrence of abnormal discharge near the monopole antenna 140 is suppressed. However, if the occurrence of such abnormal discharge is not taken into consideration, the monopole antenna 140 may be allowed to protrude from the lower surface of the ceiling plate 110 (frame 110a) without forming the recess as illustrated in FIG. 10. Furthermore, from the viewpoint of more effectively preventing the occurrence of abnormal discharge, a dielectric member 181 may be embedded in the recess 158 as illustrated in FIG. 11. In addition, as illustrated in FIG. 12, the monopole antenna 140 may be installed so as to protrude from the lower surface of the ceiling plate 110 (frame 110a), and a dielectric cap 182 may be installed to surround the monopole antenna 140. When the dielectric member is installed to surround the monopole antenna 140 as illustrated in FIGS. 11 and 12, the wavelength of the surface wave becomes an effective wavelength $\lambda g$.

<Operation of the Plasma Processing Apparatus>

Next, an operation of the plasma processing apparatus 100 configured as described above will be described.

First, a wafer W is loaded into the chamber 1 and mounted on the susceptor 11. Then, a microwave is introduced into the chamber 1 from the plasma source 2 while introducing a plasma-generating gas, for example, an Ar gas, into the chamber 1 from the gas supply source 27 via the pipe 28 and the gas introduction member 26 so as to form plasma. The plasma formed at this step becomes surface wave plasma.

After the plasma is formed, a processing gas, for example, an etching gas such as a $Cl_2$ gas or the like, is discharged from the processing gas supply source 27 into the chamber 1 via the pipe 28 and the gas introduction member 26. The discharged processing gas is excited by the plasma of the plasma-generating gas and then is plasmarized. A plasma process, for example, an etching process, is performed on the wafer W by the plasma of the processing gas.

When generating the plasma, in the plasma source 2, microwave power oscillated from the microwave oscillator 32 of the microwave output section 30 is amplified by the amplifier 33 and then distributed to a plurality of parts by the distributor 34. The distributed microwave power is guided to the microwave supplier 40. In the microwave supplier 40, the microwave powers distributed to the plurality of parts as described above are individually amplified by the main amplifier 48 constituting the solid state amplifier, and supplied to the waveguide 44 of the microwave radiation mechanism 41. In the microwave radiation mechanism 41, in a state in which the impedance is automatically matched by the tuner 60 and electric power reflection does not substantially exist, the microwave is radiated into the chamber 1 via the slot 81a of the planar slot antenna 81 of the antenna part 43 and the microwave transmission window 110b, and then spatially synthesized.

The power supply to the waveguide 44 of the microwave radiation mechanism 41 is performed from the side surface of the waveguide 44 via the coaxial line 56. That is, the microwave (electromagnetic wave) propagated from the coaxial line 56 is supplied from the microwave power introduction port 55 installed on the side surface of the waveguide 44 to the waveguide 44. When the microwave (electromagnetic wave) reaches the first pole 92 of the feed antenna 90, the microwave (electromagnetic wave) propagates along the antenna main body 91 and is radiated from the second pole 93 at the leading end of the antenna main body 91. In addition, the microwave (electromagnetic wave) propagating through the antenna main body 91 is reflected by the reflector 94 and is synthesized with an incident wave to generate a standing wave. When the standing wave is generated at a position where the feed antenna 90 is arranged, an induced magnetic field is generated along the outer wall of the inner conductor 53 to thereby generate an induced electric field. Due to these chain actions, the microwave (electromagnetic wave) propagates through the waveguide 44 and is guided to the antenna part 43.

The microwave radiation mechanism 41 is very compact because the antenna part 43 and the tuner 60 are integrated. Therefore, the surface wave plasma source 2 itself can be compacted. Furthermore, the main amplifier 48, the tuner 60, and the planar slot antenna 81 are installed close to one another. In particular, the tuner 60 and the planar slot antenna 81 may be configured as a concentrated constant circuit. In addition, by designing the composite resistance of the planar slot antenna 81, the wave retardation member 82, and the microwave transmission window 110b to be 50Ω, plasma load can be tuned with high accuracy by the tuner 60. Moreover, since the tuner 60 constitutes a slag tuner that can perform impedance matching by moving the two slags 61a and 61b, the tuner 60 is compact and can minimize losses. Furthermore, since the tuner 60 and the planar slot antenna 81 are close to each other in this way and constitute a concentrated constant circuit and serve as a resonator, it is possible to eliminate impedance mismatch up to the planar slot antenna 81 with high accuracy and to allow a substantially mismatched portion to become a plasma space. Thus, high-precision plasma control becomes possible by the tuner 60.

Meanwhile, in the plasma processing apparatus, the technique for monitoring the plasma density when performing the plasma process has been eagerly desired from the viewpoint of the process management, apparatus management, or the like. However, in an actual process, it is difficult to measure the plasma density using a measurement probe used in an experiment due to deterioration of process distribution, generation of contamination and particles, or the like. Therefore, monitoring the plasma density in real time in the actual plasma process has not been successful yet.

Therefore, the present inventors have studied the technique for monitoring the plasma density. As a result, it was found that, in the case of the surface wave plasma as in the present embodiment, the wavelength $\lambda_{SW}$ of the surface wave can be detected by installing the monopole antenna 140 in a vicinity of the wall surface in the chamber 1 and detecting the surface wave detection current $I_{SW}$ by means of changing the length of the monopole antenna 140. Furthermore, it was found that, by using the fact that the wavelength $\lambda_{SW}$ of the surface wave depends on the plasma density in the plasma process, the plasma density can be obtained from the detected wavelength $\lambda_{SW}$ of the surface wave, and thus the plasma density can be monitored.

Therefore, in the present embodiment, the wavelength $\lambda_{SW}$ of the surface wave is detected by detecting the surface wave detection current $I_{SW}$ by means of adjusting the length of the monopole antenna 140 protruding vertically from the inner wall surface of the chamber 1 into the chamber 1, and the density of the surface wave plasma is monitored based on it.

In the conventional plasma process which radiates the microwave to form the surface wave plasma, the wavelength of the microwave itself can be recognized from the frequency, but the wavelength of the surface wave itself of the surface wave plasma has not been recognized. On the other hand, according to the present embodiment, it was found that the wavelength of the surface wave of the surface wave plasma can be recognized by a simple method in which the surface wave detection current $I_{SW}$ is detected while inserting the monopole antenna 140 into the chamber 1 and changing the length thereof. Furthermore, the plasma density of the surface wave plasma can be monitored from the relationship between the plasma density and the wavelength of the surface wave.

Although it is not practical to use the measurement probe used in the experiment in the actual process due to the deterioration of process distribution, generation of contamination and particles, or the like, this problem does not occur when the wavelength $\lambda_{SW}$ of the surface wave is detected using the monopole antenna 140 according to the present embodiment.

In the present embodiment, the length adjuster 160 for adjusting the length of the monopole antenna 140 moves the slider 151 up and down via the nut part 155 and elevates and lowers the elevating member 157 together therewith by rotating the screw rod 154 by the motor 153. In this case, by using the high-precision stepping motor as the motor 153, the length d of the monopole antenna 140 can be adjusted with high accuracy in 0.1 mm steps.

In addition, when the wavelength $\lambda_{SW}$ of the surface wave is detected by detecting the surface wave detection current $I_{SW}$ by means of adjusting the length of the monopole antenna 140, specifically, this may be performed based on the illustration in FIG. 8. That is, by using the fact that the value of the surface wave detection current $I_{SW}$ (i.e., the voltage value $V_{SW}$) becomes a maximum value when the length d of the monopole antenna 140 is $\lambda_{SW}/4$ and becomes 0 when the length d is $\lambda_{SW}/2$, the wavelength $\lambda_{SW}$ of the surface wave is obtained by the value of d at which the voltage value $V_{SW}$ becomes maximum or 0. Furthermore, since the value of the surface wave detection current $I_{SW}$ (i.e., the voltage value $V_{SW}$) is at maximum value when the length d is $(2n-1) \times \lambda_{SW}/4$ and becomes 0 when the length d is $n \times \lambda_{SW}/2$, $(2n-1) \times \lambda_{SW}/4$ and $n \times \lambda_{SW}/2$ may be used without being limited to $\lambda_{SW}/4$ and $\lambda_{SW}/2$.

In addition, if the monopole antenna 140 is exposed while protruding into the chamber 1, abnormal discharge may occur near the monopole antenna 140. On the other hand, in the present embodiment, the recess 158 having a size allowing the surface wave to enter is formed in a portion of the frame 110a of the ceiling plate 110 constituting the upper wall of the chamber 1, and the monopole antenna 140 protrudes from the bottom surface of the recess 158 into the chamber 1. Therefore, the monopole antenna 140 is prevented from being exposed while protruding into the plasma space, thereby preventing abnormal discharge due to the monopole antenna 140. Furthermore, in FIGS. 11 and 12, since the monopole antenna 140 is covered with the dielectric member, it is possible to more effectively prevent abnormal discharge due to the monopole antenna 140.

The technique for measuring the surface wave using the monopole antenna in the microwave plasma processing apparatus is described in Japanese laid-open publication No. 2013-77441. However, this technique monitors a surface wave propagating through a dielectric material, and is not intended to detect the wavelength of the surface wave of the plasma or to monitor the plasma density.

<Other Applications>

While one embodiment has been described above, the embodiment disclosed this time should be considered as illustrative and not restrictive in all respects. The aforementioned embodiment may be omitted, replaced, or modified in various forms without departing from the scope and spirit of the accompanying claims.

For example, in the aforementioned embodiment, the plasma source having the plurality of microwave radiation mechanisms having the waveguide having a coaxial structure for transmitting the microwave, the planar slot antenna, and the microwave transmission window has been described as an example, but may have a single microwave radiation mechanism.

Furthermore, in the aforementioned embodiment, the etching processing apparatus is exemplified as the plasma processing apparatus. However, the present disclosure is not limited thereto and may be applied to another plasma process such as a film-forming process, an oxynitride film process, an ashing process, or the like. Moreover, the substrate is not limited to the semiconductor wafer W but may be another substrate such as a flat panel display (FPD) substrate represented by a substrate for a liquid crystal display (LCD), a ceramics substrate, or the like.

According to the present disclosure in some embodiments, it is possible to provide a plasma density monitor capable of monitoring an actual plasma density during a plasma process, and a plasma processing apparatus and a plasma processing method using the same.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma density monitor for monitoring a plasma density of surface wave plasma in a plasma processing apparatus which forms the surface wave plasma in a chamber accommodating a substrate and performs a plasma process on the substrate, the monitor comprising:
   a monopole antenna installed to extend from a wall of the chamber toward an interior of the chamber and to be perpendicular to an inner wall surface of the chamber, and configured to receive a surface wave formed in a vicinity of the wall of the chamber;
   a coaxial line configured to extract a detection value from a signal received by the monopole antenna;
   a length adjuster configured to adjust a length of the monopole antenna; and
   a controller configured to control the length adjuster so as to obtain a wavelength of the surface wave from a relationship between the length of the monopole antenna and the detection value of the surface wave detected through the coaxial line, and to obtain the plasma density of the surface wave plasma from the wavelength of the surface wave based on a relationship between the plasma density and the wavelength of the surface wave.

2. The monitor of claim 1, wherein the detection value extracted by the coaxial line is a current value of the surface wave.

3. The monitor of claim 2, wherein the current value is detected through a voltage drop of a resistor.

4. The monitor of claim 3, wherein the controller is configured to obtain the wavelength of the surface wave by setting the length of the monopole antenna when the current value of the surface wave becomes a maximum value to $(2n-1) \times \lambda_{SW}/4$ (where $\lambda_{SW}$ is the wavelength of the surface wave and n is a natural number of 1 or more).

5. The monitor of claim 4, wherein the monopole antenna is extended from a ceiling plate constituting an upper wall of the chamber toward the interior of the chamber.

6. The monitor of claim 5, wherein the monopole antenna is configured by a leading end portion of an antenna rod inserted from above the chamber toward the interior of the chamber and existing in the chamber.

7. The monitor of claim 6, wherein the length adjuster is configured to adjust the length of the monopole antenna by moving the antenna rod up and down.

8. The monitor of claim 7, wherein a portion of the antenna rod other than the monopole antenna is configured to form an inner conductor of the coaxial line.

9. The monitor of claim 2, wherein the controller is configured to obtain the wavelength of the surface wave by setting the length of the monopole antenna when the current value of the surface wave becomes a maximum value to $(2n-1) \times \lambda_{SW}/4$ (where $\lambda_{SW}$ is the wavelength of the surface wave and n is a natural number of 1 or more).

10. The monitor of claim 2, wherein the controller is configured to obtain the wavelength of the surface wave by setting the length of the monopole antenna when the current value of the surface wave becomes 0 to $n \times \lambda_{SW}/2$ (where $\lambda_{SW}$ is the wavelength of the surface wave and n is a natural number of 1 or more).

11. The monitor of claim 1, wherein the monopole antenna is extended from a ceiling plate constituting an upper wall of the chamber toward the interior of the chamber.

12. The monitor of claim 1, wherein a dielectric member is installed to surround the monopole antenna.

13. The monitor of claim 1, wherein the monopole antenna is installed to protrude vertically from a bottom surface of a recess formed on an inner wall of the chamber.

14. The monitor of claim 13, wherein a dielectric material is embedded in the recess.

15. A plasma processing apparatus for performing a process on a substrate by plasma,
   a chamber configured to accommodate the substrate;
   a microwave output section configured to output a microwave;
   a microwave radiation mechanism connected to the microwave output section, installed on the chamber, and including: a slot antenna which is installed in a microwave transmission path configured to transmit the microwave outputted from the microwave output section and has a slot configured to radiate the microwave; and a microwave transmission window made of a dielectric material for transmitting the microwave radiated from the slot; and
   the plasma density monitor of claim 1, configured to monitor the plasma density of the surface wave plasma formed in the chamber by the microwave radiated from the microwave radiation mechanism.

16. A plasma processing method for forming surface wave plasma in a chamber accommodating a substrate and performing a plasma process on the substrate, the method comprising:
   installing a monopole antenna, which is configured to receive a surface wave formed in a vicinity of a wall of the chamber, to extend from the wall of the chamber toward an interior of the chamber and to be perpendicular to an inner wall surface of the chamber, so as to be adjustable in a length of the monopole antenna;

performing the plasma process on the substrate by forming the surface wave plasma in the chamber;

obtaining a wavelength of the surface wave from a relationship between the length of the monopole antenna and a detection value of the surface wave detected through a coaxial line by adjusting the length of the monopole antenna during the plasma process; and obtaining a plasma density of the surface wave plasma from the wavelength of the surface wave based on a relationship between the plasma density and the wavelength of the surface wave.

17. The method of claim 16, wherein the detection value extracted by the coaxial line is a current value of the surface wave.

18. The method of claim 17, wherein the current value is detected through a voltage drop of a resistor.

19. The method of claim 17, wherein the wavelength of the surface wave is obtained by setting the length of the monopole antenna when the current value of the surface wave becomes a maximum value to $(2n-1) \times \lambda_{SW}/4$ (where $\lambda_{SW}$ is the wavelength of the surface wave and n is a natural number of 1 or more).

20. The method of claim 17, wherein the wavelength of the surface wave is obtained by setting the length of the monopole antenna when the current value of the surface wave becomes 0 to $n \times \lambda_{SW}/2$ (where $\lambda_{SW}$ is the wavelength of the surface wave and n is a natural number of 1 or more).

* * * * *